(12) United States Patent
Yang et al.

(10) Patent No.: US 6,495,908 B2
(45) Date of Patent: Dec. 17, 2002

(54) MULTI-CHIP SEMICONDUCTOR PACKAGE

(75) Inventors: Cheng-Hsung Yang, Taichung (TW); Chin-Yuan Hung, Taichung (TW); Jian-Xheng Liu, Taichung (TW)

(73) Assignee: Siliconware Precision Industries, Co., Ltd.. (TW)

( * ) Notice: Subject to any disclaimer, the term of this patent is extended or adjusted under 35 U.S.C. 154(b) by 0 days.

(21) Appl. No.: 09/973,359

(22) Filed: Oct. 9, 2001

(65) Prior Publication Data

US 2002/0149103 A1 Oct. 17, 2002

(30) Foreign Application Priority Data

Apr. 12, 2001 (TW) ........................................ 90108742 A

(51) Int. Cl.[7] ........................ H01L 23/495; H01L 21/44; H01L 21/48; H01L 21/50
(52) U.S. Cl. ........................ 257/676; 257/666; 257/670; 438/111
(58) Field of Search ................................ 257/670, 676, 257/666; 438/111

(56) References Cited

U.S. PATENT DOCUMENTS 5,459,350 A * 10/1995 Date et al. .................. 257/666
6,307,256 B1 * 10/1998 Chiang et al. ............... 257/668
5,898,220 A   4/1999 Ball ........................... 257/723

* cited by examiner

Primary Examiner—Tuan H. Nguyen
Assistant Examiner—Nema Berezny
(74) Attorney, Agent, or Firm—Peter F. Corless; Steven M. Jensen; Edwards & Angell, LLP

(57) ABSTRACT

A multi-hip semiconductor package is proposed, in which a first chip and a second chip are mounted on opposing surfaces of a lead frame in a staggered manner. This staggered arrangement assures the die bonding quality for firmly disposing the second chip in the semiconductor package without being detrimental affected by the first chip. Moreover, as both opposing surfaces of the lead frame have chips mounted thereon, a mold flow of a molding resin used in a molding process can be balanced, so that turbulence the mold flow is decreased, and void formation can be avoided. In addition, the semiconductor package can incorporate a third chip in a stacked manner with respect to the first or second chip. This therefore further improves the functionality and performance of the semiconductor package.

19 Claims, 5 Drawing Sheets

MULTI-CHIP SEMICONDUCTOR PACKAGE

FIELD OF THE INVENTION

The present invention relates to multi-chip semiconductor packages, and more particularly, to a multi-chip semiconductor package, in which two semiconductor chips are disposed in a staggered manner.

BACKGROUND OF THE INVENTION

A conventional semiconductor package generally includes a metal lead frame having a die pad and a plurality of leads, for disposing a semiconductor chip on the die pad and electrically connecting the chip to the corresponding leads by bonding wires. The chip, the die pad and part of the leads are encapsulated in an encapsulant, in an effort to protect the semiconductor package from damp, dust or damage.

However, in accordance with higher demand for operational function and speed of electronic products, more semiconductor devices are employed on a motherboard, or integrated circuits with higher integration level are utilized on a semiconductor chip. Nevertheless, the motherboard needs to expand its surface area for accommodating the larger number of the semiconductor devices, and this is undesirable in response to a trend for developing low-profile electronic products. Increase in integration level for the semiconductor chip is possibly limited by present manufacturing technology and is cost-ineffective to implement. Thus, an effective solution is to incorporate two or more chips in one semiconductor package, so as to raise the density of integrated circuits, the memory capacity and the process speed.

U.S. Pat. No. 5,898,220 discloses a multi-chip semiconductor package. Referring to FIG. 1, the semiconductor package includes a first semiconductor chip 11, a second semiconductor chip 12 and a lead frame 10. The first and second chips 11, 12 each possesses a top surface 110, 120 (where electric circuits and electronic components are disposed) and an opposing bottom surface 111, 121, respectively. On each of the top surfaces 110, 120 there are formed two rows of bond pads 112, 122 at two opposite sides. The lead frame 10 is composed of a plurality of leads 14, wherein a surface of the leads 14 for mounting the first chip 11 thereon is referred to as a first surface 140, while a surface of the leads 14 opposing the first surface 140 is referred to as a second surface 141.

As shown in the drawing, a nonconductive first tape 150 is adhered to the first surface 140 of the leads 14, and then the top surface 110 of the first chip 11 is firmly attached to the first tape 150 by using a conventional jig (not shown) under heat and pressure. Further, a plurality of gold wires 16 are used to electrically connect the bond pads 112 on the top surface 110 of the first chip 11 to the first surface 140 of the leads 14. Similarly, the second chip 12 is attached to the second surface 141 of the leads 14 by means of a second tape 151, and the bond pads 122 on the second chip are electrically connected to the second surface 141 of the leads 14 by a plurality of gold wires 16. Finally, an encapsulant 17 is formed to encapsulate the first chip 11, the second chip 12, the gold wires 16 and a portion of the leads 14 close to the chips, so as to protect the semiconductor chips from outside moisture and pollutant.

In the use of the jig (as shown in FIG. 2 by a reference numeral 18), a heat source is provided for heating the tapes to firmly attach the semiconductor chips to the leads. However, as shown in FIG. 2, after completing the attachment of the first chip 11, due to heat blockage by the first chip 11 and the highly heat-resistant first tape 150, the second tape 150 receives heat in reduced transmission efficiency, and thus the second chip 12 is unable to be firmly bonded by means of the second tape 150, resulting in increase in the reliability concern for die bonding. Moreover, in order to successively bonding the gold wires 16 to respectively the first chip II and the leads 14, the second tape 151 needs to be dimensioned in thickness slightly larger than the height of wire loops of the gold wires 16. In consideration of replacing the second tape 151 with a conventional nonconductive adhesive for improving the problem of poor beat transmission as described above, however, an adhesive layer formed by the adhesive with high fluidity is hardly controlled in thickness, and thus the gold wires 16 may suffer suppression from the second chip 12, resulting in poor wire bonding quality.

In addition, in a molding process for the foregoing semiconductor package, as shown in FIG. 3, after a melted molding resin (not shown) is injected into a mold (not shown), a mold flow direction is perpendicular to gaps 142 between the leads 14, which are interposed between the first and second chips 11, 12. This therefore makes the molding resin hardly flow into the gaps 142, and the gaps 142 not completely filled with the molding resin easily have voids formed therein. Accordingly, a popcorn effect can be generated in the semiconductor package operating in a high temperature environment due to thermal expansion of air in the voids.

SUMMARY OF THE INVENTION

A primary objective of the present invention is to provide a multi-chip semiconductor package, in which chips are disposed in a staggered manner, so as to improve heat transmission efficiency of a jig in a die bonding process and thus maintain the die bonding reliability.

Another objective of the present invention is to provide a multi-chip semiconductor package, in which staggered chips allow a mold flow of a molding resin to be balanced and thus avoid void formation.

A further objective of the present invention is to provide a multi-chip semiconductor package, in which chips are simultaneously incorporated in lead-on-chip (LOC) and non-LOC manners.

A further objective of the present invention is to provide a multi-chip semiconductor package, in which chips are employed with no restriction on size.

A further objective of the present invention is to provide a multi-chip semiconductor package, in which no special jig is needed, and thus the fabrication cost is reduced.

According to the foregoing and other objectives, the present invention proposes a multi-chip semiconductor package, including: a lead frame having a front surface and an opposing back surface, and consisting of a die pad and a plurality of leads surrounding the die pad, wherein the die pad is firmly held at a position deviating from the center of the lead frame by a plurality of supporting elements; a first chip having an active surface and an opposing inactive surface, and bonded to the die pad on the front surface of the lead frame by means of an adhesive; a second chip having an active surface and an opposing inactive surface, wherein the active surface is attached to the supporting elements on the back surface of the lead frame and the leads formed around the supporting elements, so as to allow the first chip and the second chip to be spatially positioned in a staggered manner, a plurality of first conductive elements for electrically connecting the first chip to the leads; a plurality of second conductive elements for electrically connecting the second chip to the leads; and an encapsulant for encapsulating the first chip, the second chip, the first conductive elements, the second conductive elements and part of the leads.

The semiconductor package of the invention is advantageous in that at least two semiconductor chips are incorporated in the same package simultaneously, and the first and second chips are respectively attached to the front and back surfaces of the lead frame in a staggered manner. This staggered arrangement makes die bonding processes performed for the first and second chips without interfering with each other, so that the second chip can be firmly disposed in the semiconductor package. This is more advantageous than the prior art, in which bonding quality of a second chip is detrimentally affected due to heat transmission blocked by a first chip located vertically with respect to the second chip. As a result, a special jig used in the die bonding process of the second chip for avoiding damage to the first chip is not necessary, and the cost for preparing such a jig is substantially saved. Furthermore, in a molding process, the staggered chips disposed on the opposing surfaces of the lead frame can balance a mold flow of a molding resin, so that turbulence to the mold flow is decreased and void formation can be avoided.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE INVENTION

Figure 1:
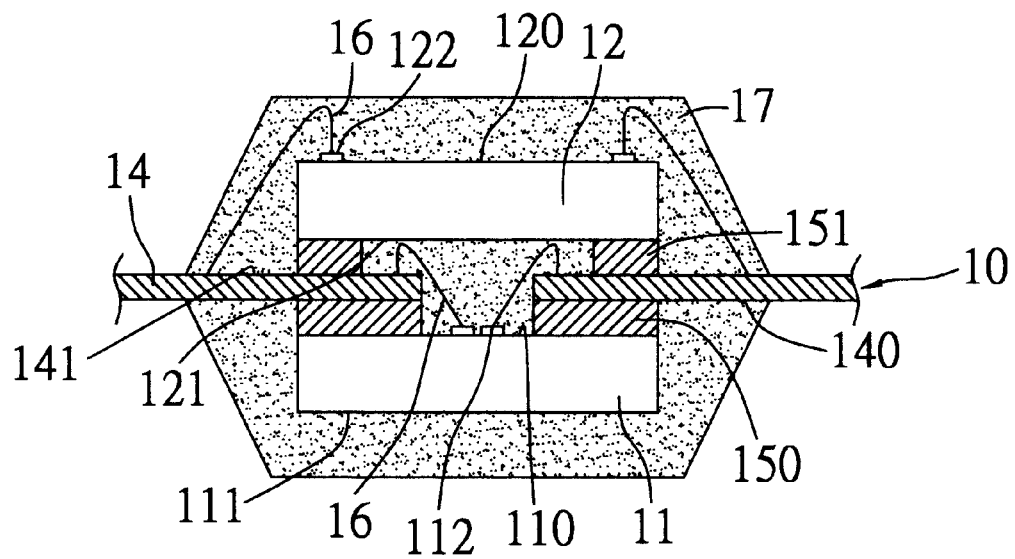
FIG. 1 (PRIOR ART) is a sectional view of a conventional semiconductor package disclosed in U.S. Pat. No. 5,898,220.
Figure 2:
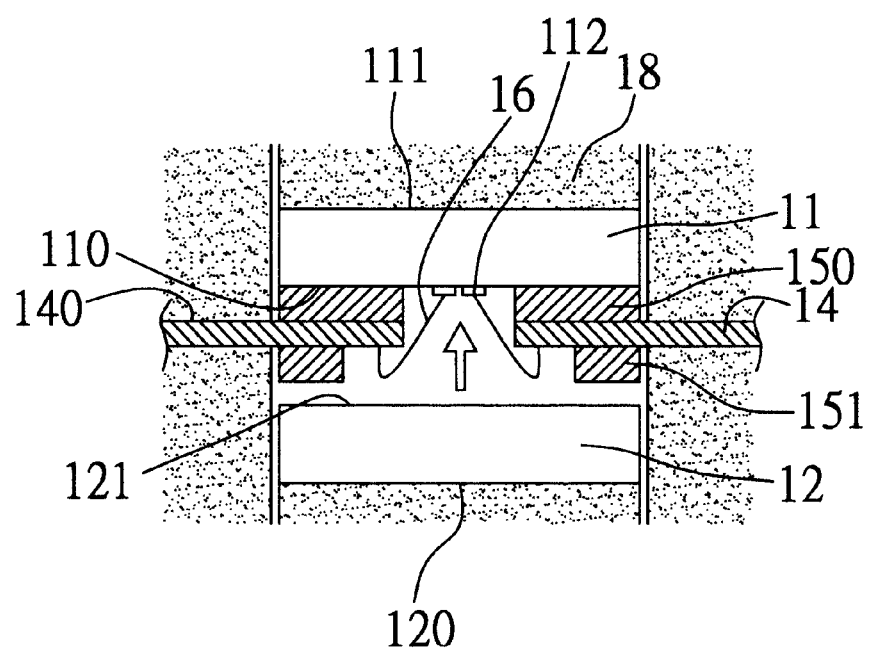
FIG. 2 (PRIOR ART) is a schematic diagram depicting the step involved in bonding a second chip in a semiconductor package of FIG. 1.
Figure 3:
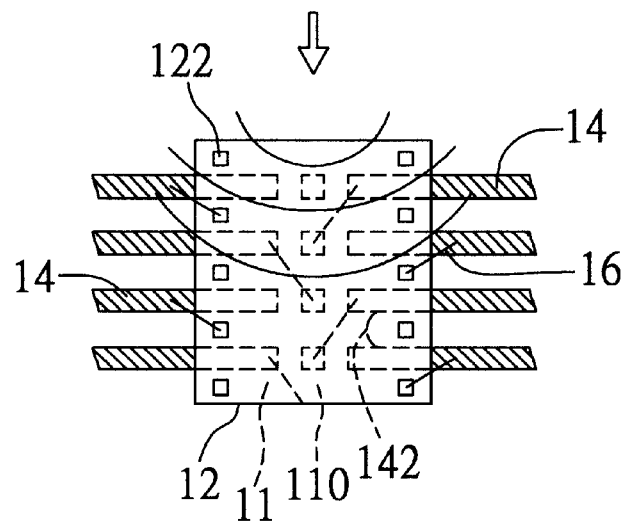
FIG. 3 PRIOR ART) is a schematic diagram depicting a mold flow curve in a molding process for a semiconductor package of FIG. 1.
Figure 4:
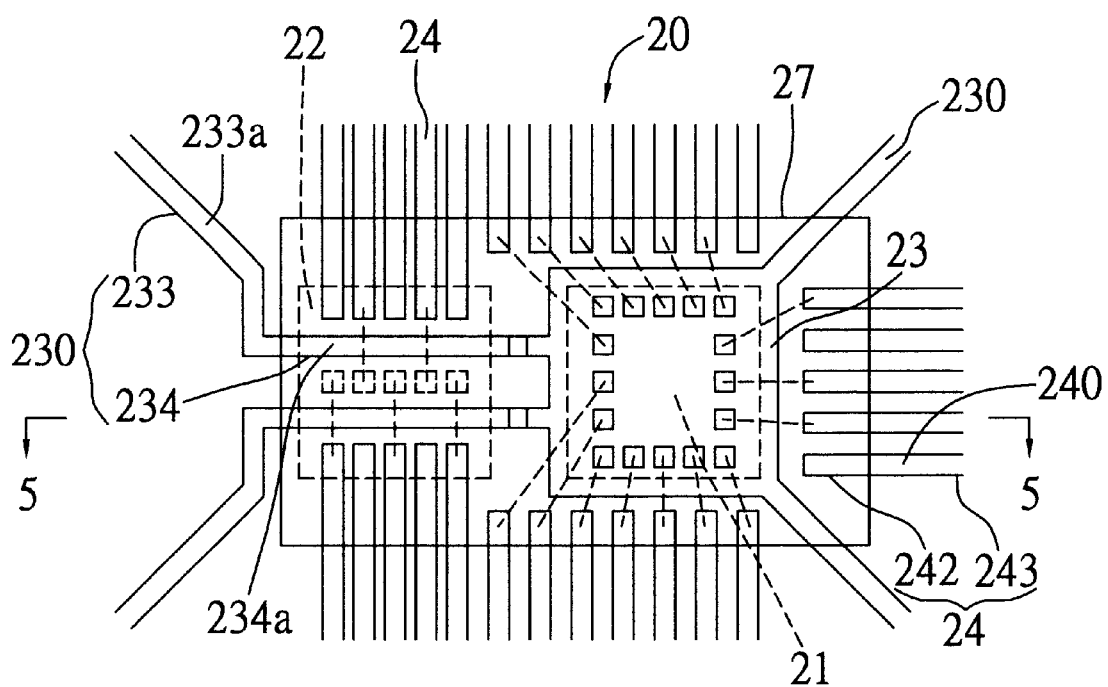
FIG. 4 is a front view of a semiconductor package of a first preferred embodiment of the invention.
Figure 5:
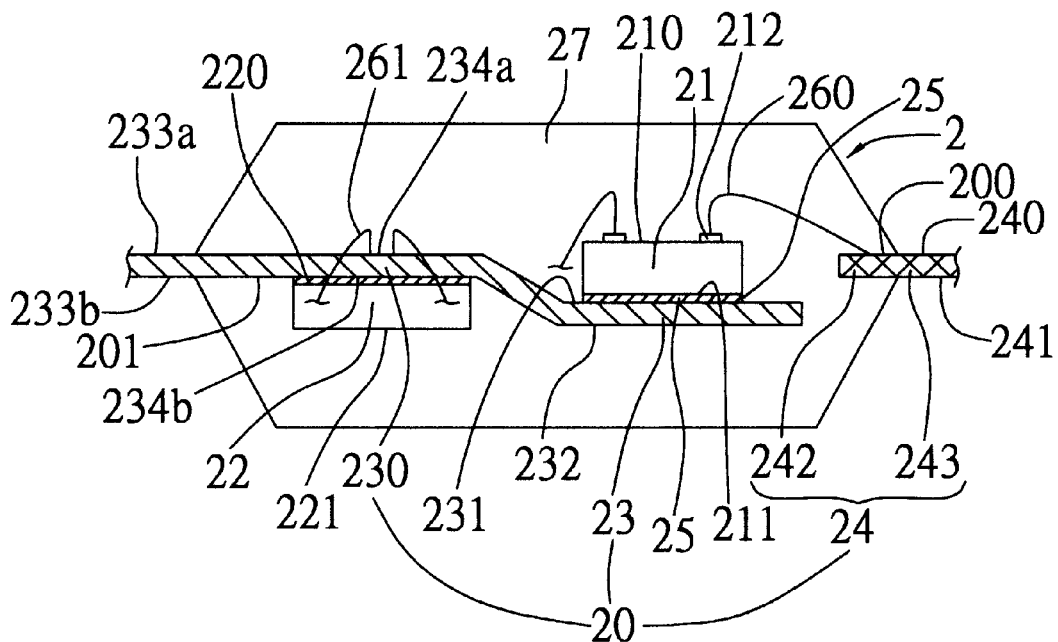
FIG. 5 is a sectional view of FIG. 4 cutting along a line 5—5.

Referring to FIGS. 4 and 5, a semiconductor package 2 of a first embodiment of the invention comprises a lead frame 20 having a plurality of leads 24 and a die pad 23 connected to a plurality of tie bars 230; a first chip 21 and a second chip 22 attached to front and back surfaces of the lead frame 20 respectively; a plurality of first bonding wires 260 for electrically connecting the first chip 21 to the leads 24; a plurality of second bonding wires 261 for electrically connecting the second chip 22 to the leads 24; and an encapsulant 27 for encapsulating the first chip 21, the second chip 22, the first bonding wires 260, the second bonding wires 261 and part of the leads 24.

FIG. 4 illustrates a front view of a lead frame used in the semiconductor package of the invention. As shown in the drawing, the lead frame 20 has a front surface 200 and an opposing back surface 201 (as shown in FIG. 5), and consists of the die pad 23, the plurality of tie bars 230 and the plurality of leads 24 surrounding the die pad 23. The die pad 23 has a top surface 231 and an opposing bottom surface 232 (as shown in FIG. 5), and is held firmly at a position deviating from the center of the lead frame 20 by means of the tie bars 230 integrated with the die pad 23. The tie bars 230 each is formed with a stamping region 233 exposed to outside of the encapsulant 27, and a die bonding region 234 encapsulated in the encapsulant 27, wherein surfaces thereof facing the same as the front surface 200 of the lead frame 20 are referred to as first surfaces 233a, 234a, and surfaces thereof facing the same as the back surface 201 (not shown) of the lead frame 20 are referred to as second surfaces 233b, 234b. Similarly, the leads 24 are also formed with outer leads 243 exposed to the outside of the encapsulant 27, and inner leads 242 encapsulated in the encapsulant 27, wherein surfaces thereof facing the same as the front surface 200 of the lead frame 20 are referred to as first surfaces 240, and opposing surfaces thereof are referred to as second surfaces 241.

As shown in FIG. 5, the first chip 21 such as a ASIC semiconductor chip has a top surface 210 disposed with electronic circuits and electronic components thereon, and a bottom surface 211 opposing the top surface 210. Two rows of bond pads 212 are formed respectively at two opposite sides on the top surface 210, and made of a conductive metal such as aluminum. Alternatively, the bond pads can be distributed at only one side or in a surrounding manner with no specific restriction. The first chip 21 has its bottom surface 211 attached to the top surface 231 of the die pad 23 by means of an epoxy resin adhesive 25 such as silver paste, or a polyimide resin tape 25, so as to allow the first chip 21 to be. firmly bonded to the die pad 23.

After completing the die bonding process for the first chip 21, the first bonding wires 260 such as gold wires are used to electrically connect the bond pads 212 of the first chip 21 to the first surfaces 240 of the inner leads 242. Then, a die bonding process for the second chip 22 is performed.

Figure 6:
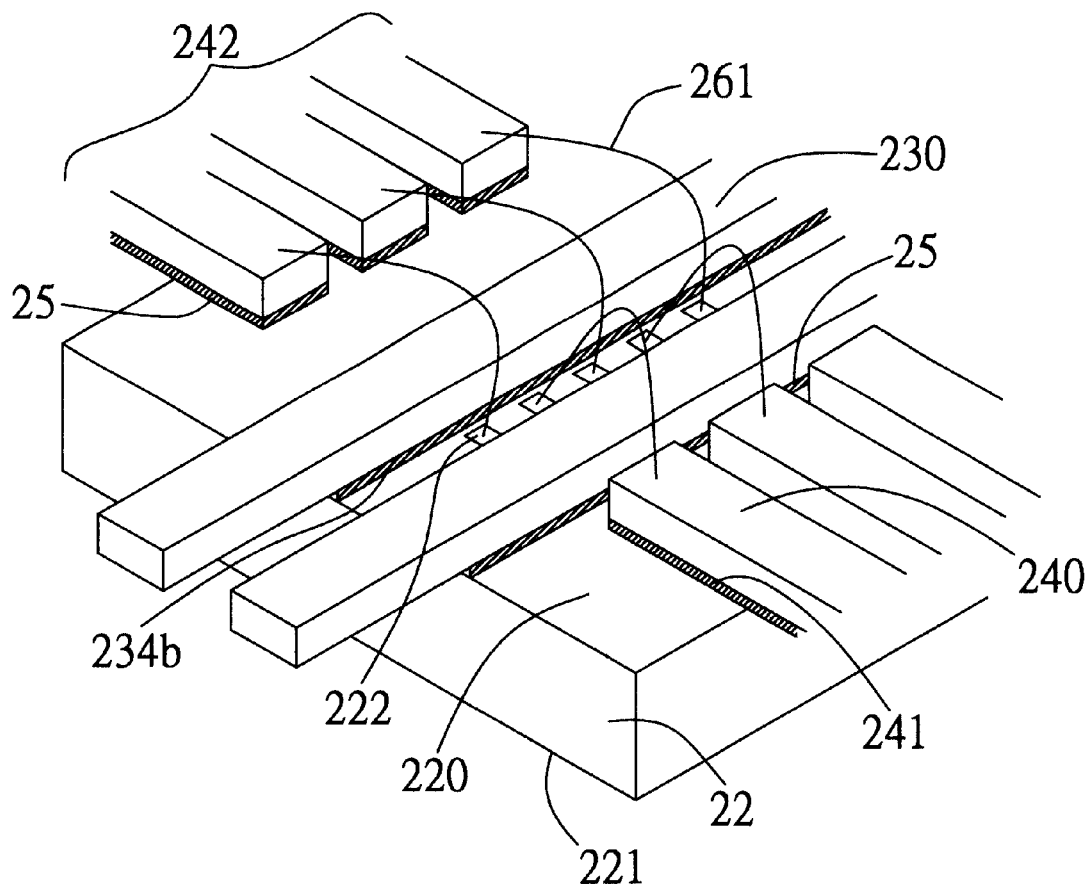
FIG. 6 is a topical enlargement diagram depicting the completion of bonding a second chip in a semiconductor package of the invention.

The second chip 22 such as a flash memory or DRAM semiconductor chip similarly has a top surface 220 disposed with electronic circuits and electronic components thereon, and a bottom surface 221 opposing the top surface 210. However, the second chip 22 differs from the first chip 21 in that only one row of bond pads 222 are formed at the center or one side of the top surface 220 of the second chip 22. As shown in FIG. 6, the second chip 22 has its top surface 220 attached to the second surfaces 241, 234b of the inner leads 242 and the die bonding regions 234 of the tie bars 230 respectively by means of an epoxy resin adhesive 25 such as silver paste, or a polyimide resin tape 25. Therefore, the first chip 21 and second chip 22 are individually bonded to the front and back surfaces of the lead frame 20 (as shown in FIG. 5), and are spatially positioned in staggered manner. After completing the foregoing die bonding process for the second chip 22 by placing this semi-fabricated structure 2 into a jig (not shown), the second bonding wires 201 cross over the tie bars 230 and electrically connect the bond pads 222 on the top surface 220 of the second chip 22 to the first surfaces 240 of the inner leads 242.

The first chip 21 and second chip 22 are not particularly limited in surface area relative to each other, that is, the first chip 21 can be dimensionally larger than, equal to or smaller than the second chip 22. Thus, the first chip 21 and second chip 22 can be more flexibly selected and combined for use in type and size (for example, a microprocessor chip or other types of chips can all be utilized), as long as they are sufficiently dimensioned to accommodate the die pad 23 and tie bars 230. Moreover, due to the two chips spatially staggered in the semiconductor package of the invention, in the die bonding process for the second chip 22, heat transmission from the jib to the second chip 22 is not affected by the staggered first chip 21, so that the second chip 22 can be firmly disposed in the semiconductor package. Further due to no concern for damaging the first chip 21 and the first bonding wires 260, no special jig is needed, and thus the cost for the jig used in the die bonding process can be efficiently reduced.

Figure 7:
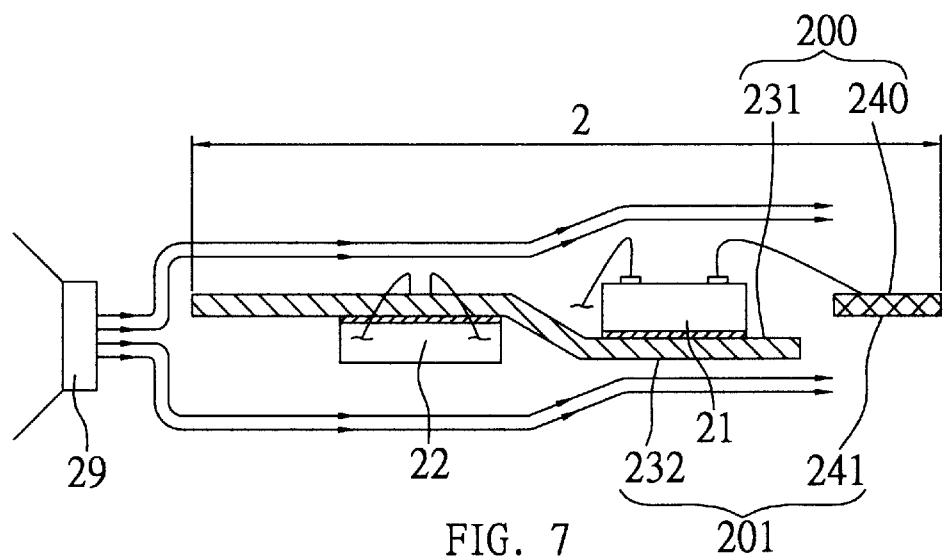
FIG. 7 is a schematic diagram depicting a mold flow direction in a molding process for a semiconductor package of the invention.

After completing the die bonding and wire bonding processes, the semi-fabricated structure 2 is placed into a molding cave of a mold (not shown) to carry out a molding process. As shown in FIG. 7, a fluid melted molding resin (not shown) is injected from an injection inlet 29 into the molding cavity for forming the encapsulant 27 (not shown) encapsulating the semiconductor chips 21, 22. Since the first chip 21 and second chip 22 are spatially staggered, and the front and back surfaces 200, 201 of the lead frame 20 are each disposed with one of the chips, thus a mold flow of the molding resin can be balanced (as indicated by arrows in FIG. 7), so that turbulence to the mold flow is decreased, and void formation can be avoided.

After curing the encapsulant at a high temperature, the outer leads 243 of the semi-fabricated structure 2 can be optionally trimmed or formed into a shape according to practical application. The outer leads can be bent into a gull-wing shape, a J-like shape, a L-like shape, etc. This therefore completes the fabrication of the semiconductor package of the invention.

Figure 8:
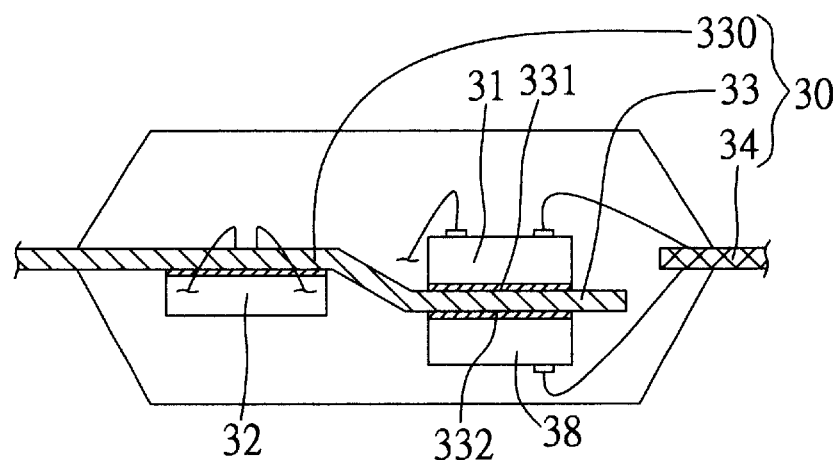
FIG. 8 is a sectional view of a semiconductor package of a second preferred embodiment of the invention.

FIG. 8 illustrates a second embodiment of the semiconductor package of the invention. The semiconductor package of the second embodiment is structurally identical to that of the first embodiment as described above, with the only difference in that, in this embodiment, besides a first chip 31 disposed on a top surface 331 of a die pad 33 of a lead frame, the die pad 33 can further accommodate a third chip 38 on a bottom surface 332 thereof. The third chip 38 is not particularly limited in size and type, as long as it can fit the sizes of the die pad 33 and tie bars 330. Therefore, the semi conductor package of the invention can further raise the integration of the semiconductor device, in a manner that more semiconductor chips can be incorporated into the same package for improving functionality and processing speed of the package.

Figure 9:
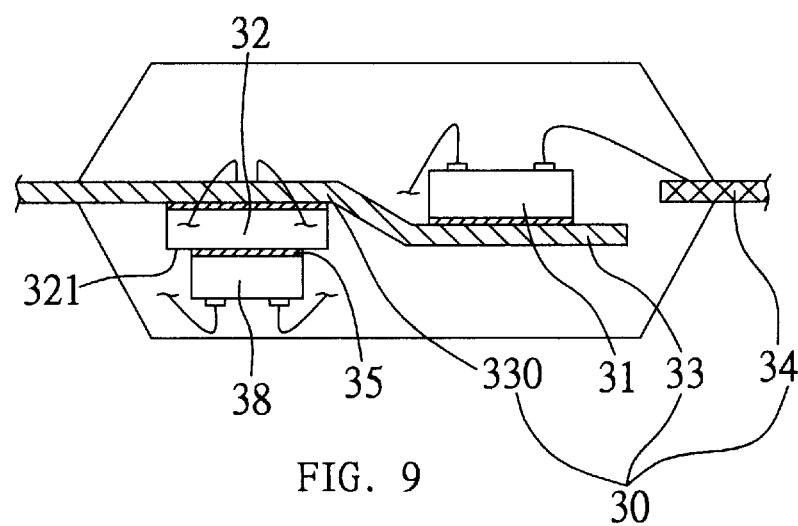
FIG. 9 is a sectional view of a semiconductor package of a third preferred embodiment of the invention.

FIG. 9 illustrates a third embodiment of the semiconductor package of the invention. The semiconductor package of the second embodiment is structurally identical to that of the first embodiment as described above, with the only difference in that, chips in this embodiment are disposed in a stacked manner, wherein, after attaching a second chip 32 to a lead frame 30, a third chip 38 is additionally bonded to a bottom surface 321 of the second chip 32 in a back-to-back manner by means of an adhesive 35. The third chip 38 can have bond pads formed thereon at one single side, at central positions or in a surrounding manner with no particular limitation.

Figure 10:
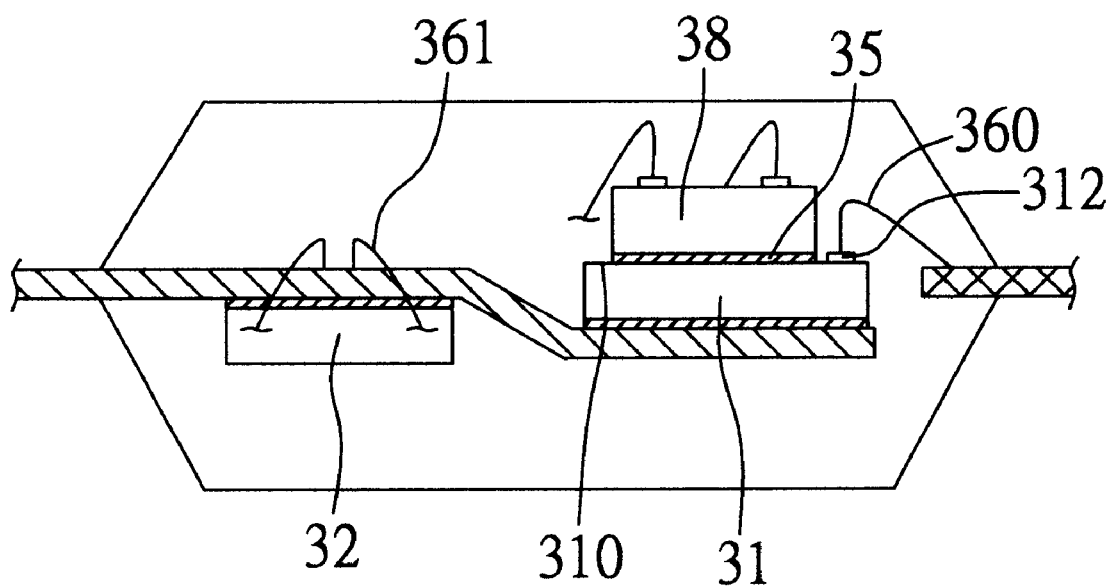
FIG. 10 is a sectional view of a semiconductor package of a fourth preferred embodiment of the invention.

FIG. 10 illustrates a fourth embodiment of the semiconductor package of the invention. The semiconductor package of the second embodiment is structurally identical to that of the first embodiment as described above, with the only difference in that, chips in this embodiment are disposed in a stacked manner, wherein a third chip 38 is bonded to a top surface 310 of a first chip 31 by means of an adhesive layer 35 made of an epoxy resin adhesive such as silver paste, or a polyimide resin tape. Since the adhesive layer 35 is made of a rubber material with elasticity, after bonding the third chip 38 to the first chip 31, the elastic adhesive layer 35 can buffer and absorb a downward pressure to the first chip 31, and thus provide protection for the top surface 310 of the first chip 31 from being damaged by the pressure. The third chip 38 needs to be dimensionally slightly smaller than the first chip 31, and the adhesive layer 35 is necessarily applied to area excluding bond pads 312 on the top surface 310 of the first chip 31, so as not to interfere with a wire bonding process of first bonding wires 360. The third chip 38 can have bond pads formed thereon at one single side, at central positions or in a surrounding manner with no particular limitation.

The semiconductor package with staggered double chips of the invention incorporating a further chip in a stacked manner can significantly improve the integration of a semiconductor device, and thus more semiconductor chips can be incorporated into the same package without increasing the overall thickness of the package. This therefore significantly raise the functionality and processing speed of integrated circuits in response to the increase in complexity of electronic signal transmission in a package.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A multi-chip semiconductor package, comprising:
    a lead frame having a front surface and an opposing back surface, and consisting of a die pad and a plurality of leads surrounding the die pad, wherein the die pad is firmly held at a position deviating from the center of the lead frame by a plurality of supporting elements;
    a first chip having an active surface and an opposing inactive surface, and bonded to the die pad on the front surface of the lead frame by means of an adhesive;
    a second chip having an active surface and an opposing inactive surface, wherein the active surface is attached to the supporting elements on the back surface of the lead frame and the leads formed around the supporting elements, so as to allow the first chip and the second chip to be spatially positioned in a staggered manner;
    a plurality of first conductive elements for electrically connecting the first chip to the leads;
    a plurality of second conductive elements for electrically connecting the second chip to the leads; and
    an encapsulant for encapsulating the first chip, the second chip, the first conductive elements, the second conductive elements and part of the leads.

2. The multi-chip semiconductor package of claim 1, wherein the supporting elements are tie bars, and a die bonding area for attaching the second chip is formed on the tie bars at the back surface of the lead frame.

3. The multi-chip semiconductor package of claim 2, wherein the second chip is attached to the die bonding area on the tie bars in a lead-on-chip (LOC) manner.

4. The multi-chip semiconductor package of claim 1, wherein surfaces of the leads facing the same as the front surface of the lead frame are referred to as first surfaces of the leads, and surfaces opposing the first surfaces of the leads are referred to as second surfaces of the leads.

5. The multi-chip semiconductor package of claim 4, wherein the second chip is attached to the second surfaces of the leads in a lead-on-chip (LOC) manner.

6. The multi-chip semiconductor package of claim 4, wherein a row of bond pads are formed at central area of the active surface of the second chip, and connected to the first surfaces of the leads by the second conductive elements crossing the supporting elements.

7. The multi-chip semiconductor package of claim 4, wherein a row of bond pads are formed at sides of the active surface of the second chip, and connected to the first surfaces of the leads by the second conductive elements crossing the, supporting elements.

8. The multi-chip semiconductor package of claim 1, wherein a plurality of bond pads are formed on the active surface of the first chip.

9. The multi-chip semiconductor package of claim 8, wherein the bond pads are distributed at one side on the first chip.

10. The multi-chip semiconductor package of claim 8, wherein the bond pads are distributed at central area on the first chip.

11. The multi-chip semiconductor package of claim 8, wherein the bond pads are distributed at peripheral area on the first chip.

12. The multi-chip semiconductor package of claim 1, wherein the first chip is selected from the group consisting of an ASIC chip, a flash memory chip and a microprocessor chip.

13. The multi-chip semiconductor package of claim 1, wherein the second chip is attached to the back surface of the lead frame in a lead-on-chip (LOC) manner.

14. The multi-chip semiconductor package of claim 1, wherein the second chip is selected from the group consisting of a flash memory chip and a mobile memory.

15. The multi-chip semiconductor package of claim 1, wherein at least one semiconductor chip is bonded to the die pad on the back surface of the lead frame.

16. The multi-chip semiconductor package of claim 1, wherein at least one semiconductor chip is bonded to the active surface of the first chip in a stacked manner by means of an adhesive layer.

17. The multi-chip semiconductor package of claim 1, wherein at least one semiconductor chip is bonded to the inactive surface of the second chip in a stacked manner by means of an adhesive layer.

18. The multi-chip semiconductor package of claim 1, wherein the first conductive elements are gold wires.

19. The multi-chip semiconductor package of claim 1, wherein the second conductive elements are gold wires.

* * * * *